US005723172A

United States Patent [19]

Sherman

[11] Patent Number: 5,723,172
[45] Date of Patent: Mar. 3, 1998

[54] METHOD FOR FORMING A PROTECTIVE COATING ON GLASS

[75] Inventor: Dan Sherman, 2790 Thomas Grade, Morgan Hill, Calif. 95037

[73] Assignee: Dan Sherman, LaSelva Beach, Calif.

[21] Appl. No.: 212,168

[22] Filed: Mar. 11, 1994

[51] Int. Cl.$^6$ .............................. B05D 5/12; C23C 16/00
[52] U.S. Cl. .................. 427/109; 427/255.1; 427/255.2; 427/249; 427/166; 427/167; 427/309; 65/60.5; 65/60.8
[58] Field of Search .................. 428/428; 427/109, 427/108, 255.1, 255.2, 255.3, 166, 249, 167, 309; 65/60.8, 60.5

[56] References Cited

U.S. PATENT DOCUMENTS

| | | | |
|---|---|---|---|
| 3,438,801 | 4/1969 | Schlientz et al. | 117/88 |
| 3,445,280 | 5/1969 | Tokuyama et al. | 117/215 |
| 3,580,709 | 5/1971 | Banks | 65/30 |
| 3,582,395 | 6/1971 | Adams et al. | 117/124 |
| 3,660,061 | 5/1972 | Donley et al. | 65/32 |
| 3,717,498 | 2/1973 | Franz et al. | 117/70 A |
| 3,811,918 | 5/1974 | Levene | 117/47 H |
| 4,019,887 | 4/1977 | Kirkbride et al. | |
| 4,093,771 | 6/1978 | Goldstein et al. | 428/312 |
| 4,100,330 | 7/1978 | Donley . | |
| 4,159,206 | 6/1979 | Armbruster et al. | 106/287.12 |
| 4,161,743 | 7/1979 | Yonezawa et al. | 357/54 |
| 4,188,444 | 2/1980 | Landau . | |
| 4,312,653 | 1/1982 | Schneider et al. | |
| 4,339,255 | 7/1982 | Ovshinsky et al. | 65/32 |
| 4,440,558 | 4/1984 | Nath et al. | 65/3.12 |
| 4,594,528 | 6/1986 | Kawakyu et al. | 313/503 |
| 4,670,033 | 6/1987 | Miura | 65/3.15 |
| 4,738,080 | 4/1988 | Stockebrand | 53/478 |
| 4,828,880 | 5/1989 | Jenkins et al. . | |
| 4,871,695 | 10/1989 | Seki et al. . | |
| 4,874,431 | 10/1989 | Fey et al. | 106/2 |
| 4,877,654 | 10/1989 | Wilson | 427/387 |
| 4,950,502 | 8/1990 | Saam et al. | 427/213.36 |
| 5,013,788 | 5/1991 | Nagashima et al. | 524/767 |
| 5,022,905 | 6/1991 | Grundy et al. | 65/60.51 |
| 5,090,985 | 2/1992 | Soubeyrand et al. | 65/60.52 |
| 5,154,970 | 10/1992 | Kaplan et al. | 427/249 |
| 5,162,136 | 11/1992 | Blum et al. | 427/226 |
| 5,165,972 | 11/1992 | Porter . | |
| 5,217,753 | 6/1993 | Goodman et al. | 427/166 |
| 5,304,394 | 4/1994 | Sauvinet et al. | 427/166 |

FOREIGN PATENT DOCUMENTS

441705A1   8/1991   European Pat. Off. .

OTHER PUBLICATIONS

Eunique Design Resources, New Product annoucement entitled: "Glass Coating", in *Glass Digest*, vol. 72 No. 3 p. 6, 15 Mar. 1993.

Asahi Glass, New Product and Technologies listing entitled: "Asahi Glass to supply water–repelling window glasses to Toyota for the Camry/Mark II", *Jari Courier*, vol. 13. No. 1 Jan. 1994.

"Silicon", McGraw–Hill Encyclopedia of Science and Technology, vol. 16, 6th Edition, 1987, pp.405–412.

"Silicone Resins", McGraw–Hill Encyclopedia of Science and Technology, vol. 16, 6th Edition, 1987, pp. 412–413.

*Primary Examiner*—Roy V. King
*Attorney, Agent, or Firm*—Townsend and Townsend and Crew LLP

[57] ABSTRACT

A method for producing a coated glass or ceramic article having a surface formed primarily from silicates, comprising the steps of contacting the uncoated glass or ceramic article in a gaseous atmosphere at a pressure of at least 700 Torr with a silane and a carbon source for a sufficient time at a temperature of less than 35° C. to form a coating on and in the glass surface, wherein the coating comprises a silicon-carbide-containing layer having a thickness of at least 100 angstroms and containing 35 to 55 atom % carbon, between 15 and 30% silicon, no more than 10% elements other than silicon, oxygen, and carbon, and the remainder oxygen. Glass and ceramic surfaces having the indicated compositions are also part of the invention.

21 Claims, No Drawings

METHOD FOR FORMING A PROTECTIVE COATING ON GLASS

INTRODUCTION

1. Technical Field

The present invention relates to methods of coating glass and ceramic materials with a transparent protective surface coating and to the materials produced by such methods.

2. Background

Glass is typically made of sand that is melted to form a clear, transparent, solid material. All silicates (sands) are formed of a fundamental molecular structural unit known as a $SiO_4$ tetrahedron, and this structural unit remains in glass. The crystal structure consists of one central silicon (Si) atom bonded to four oxygen (O) atoms that can be shared with other silicon atoms to form an indefinitely extending chain, sheet, or three-dimensional network.

Ordinary float glass (the most commonly used type of glass, named for its production process in which molten glass is floated on molten metal to provide a smooth surface) includes additional amounts of soda ($Na_2O$), usually added in the form of sodium carbonate or nitrate during the production process, lime (CaO), and other oxides (usually aluminum and magnesium oxides) to form the soda-lime-silica structure known as soda-lime glass. This is the most common glass form in general use because of its relatively low cost of production. Special glasses can be prepared that incorporate other substances to provide glass with improved durability or other desired properties. For example, boron oxide ($B_2O_3$) can be added to provide glass with a low thermal expansion coefficient capable of withstanding frequent and rapid thermal changes, such as heat-resistant Pyrex glass products (borosilicates), or lead oxide (PbO) can be added to provide optical glass having a high index of refraction.

Maintaining glass in a clean state is a problem for all types of glass but is a particular problem for glass that has been given a roughened surface, such as with sandblasting. Artistic glass having a pattern sandblasted into its surface has gained popularity in various uses where the glass may be exposed to dirt, grease, oils, and other foreign materials. For example, such glass is frequently used on shower doors, where the glass is exposed to combinations of hard-water soap scum and oils. The untreated sandblasted surface of the glass is porous and difficult to clean.

Methods currently used commercially to seal sandblasted surfaces of artistic glass are primarily polishes or waxes that impart a temporary surface coating. These polishes readily oxidize and lose transparency, but are transparent when buffed. They are functional for a brief period of time and tend to have much diminished properties when subject to weather exposure, incidental temperatures above normal ambient, direct sunlight, or hot water. They are not durable and must be frequently reapplied to impart continued functionality.

Other surface treatments for glass are known in the art. For example, surfaces have been treated to enhance some sequential process step, such as treatment with a primer to promote adhesion of silicone sealants. Reflective metallic coatings, metalization for thermal properties, coatings to limit transmission of infrared (IR) or ultraviolet (UV) wavelengths of light, etc. have been applied to glass surfaces for various purposes. These applications are usually done at elevated (200°–650° C.) temperatures, in conjunction with a reduced pressure vacuum environment and in a rigidly controlled atmosphere, the exception being the adhesion promoters or sealant primers.

Much existing glass manufacturing technology relating to sealing surfaces with various compositions containing silicon, such as silane and its numerous organic derivatives, is directed toward pyrolysis methods that apply a silicon film to heated glass in a controlled inert atmosphere, sometimes a vacuum. The silicon film applied by this method is often used as a base for subsequent metallic depositions, either by pyrolysis techniques, chemical vapor deposition (CVD), or sputtering, although in some cases the coating is applied for other purposes, such as to increase resistance of the glass to alkali.

For example, U.S. Pat. No. 4,100,330 describes a process for coating a glass substrate with a first layer of silicon and a second layer of metal oxide using the pyrolytic decomposition (at a temperature of at least about 400° C.) of a metal coating compound vapor at the surface of the hot substrate. U.S. Pat. No. 4,019,887 describes a coating consisting of or containing silicon that is produced using a silane-containing gas at a temperature of at least 400° C. U.S. Pat. No. 4,188,444 describes a glass coated with an alkali-resistant silicon coating by moving the glass past a coating station while the glass is at a temperature of at least 400° C. U.S. Pat. No. 4,828,880 describes coatings on glass which act as barriers to migration of alkali ions produced by pyrolysis of a gaseous mixture of a silane, an unsaturated hydrocarbon, and carbon dioxide on a hot glass surface at a temperature of 600° to 750° C. U.S. Pat. No. 5,165,972 describes a similar barrier coating produced by pyrolysis of a silane on the glass surface above 600° C. in the presence of a gaseous electron-donating compound.

In at least one case, silanes have been used at lower temperatures in the presence of a reaction aid that assists decomposition (such as water) while applying energy (exemplified as electromagnetic radiation, X rays, and electron beams) to decompose the silane in order to consolidate the free pores of porous glass. These reactions were carried out under reduced pressure (0.1–0.01 Torr) using a vacuum reaction chamber. See U.S. Pat. No. 4,670,033.

Both high temperature pyrolysis and vacuum techniques require the use of equipment that increases the expense of the glass-treatment process. In view of these deficiencies of the prior art, there is a need for a new coating process that provides a permanent coating to protect porous glass surfaces without requiring either high temperatures or vacuum equipment, and for the new compositions produced by such a process.

SUMMARY OF THE INVENTION

Accordingly, it is an object of the present invention to provide a protective, transparent surface, especially for use on patterned glass, such as sandblasted artistic glass, that will prevent the adhesion of grease, oils, dirt, and foreign materials which reduce the visual effect of the glass.

It is also an object of the invention to reduce porosity of such glass surfaces so that the surface of, for example, sandblasted areas, is less prone to collect foreign debris than if uncoated.

It is a further object of the invention to provide a coated glass which is easier to keep clean, is less prone to chemical attack, and is more resistant to scratches than uncoated glass.

It is yet another object of the invention to provide a coating that is functionally permanent and does not need to be reapplied.

It is a still further object of the invention to provide a coating having the indicated properties that does not require the use of high temperatures or of energy in another form (such as electromagnetic irradiation) and which does not required the use of vacuum-proof equipment in order to reduce the cost of coating operations.

These and other objects of the invention as will hereinafter become more readily apparent have been accomplished by providing a method for producing a coated glass or ceramic article having a surface formed primarily from silicates, comprising the steps of contacting the uncoated glass or ceramic article in a gaseous atmosphere with a silane and a carbon source at a temperature of less than 35° C. for a sufficient time to form a coating on and in the glass surface, wherein the coating comprises a silicon-carbide-containing layer having a thickness of at least 100 angstroms and containing 35 to 55 atom % carbon, between 15 and 30% silicon, no more than 10% elements other than silicon, oxygen, and carbon, and the remainder oxygen. The coated glass or ceramic so produced is also part of the present invention.

DESCRIPTION OF SPECIFIC EMBODIMENTS

The permanent transparent hydrophobic coating of this invention is a high carbon content coating formed by the reaction of a silane and a carbon source (which can be part of the silane) at ambient temperature and pressures and at sufficiently low concentrations in the treatment atmosphere such that the silane and carbon source are in the gaseous state when they contact the glass surface. The coating can be applied to ordinary soda-lime float glass or to any other type of glass, glazed ceramic, or glass-covered object having a surface formed primarily from silicon oxides by low temperature (ambient) CVD (chemical vapor deposition) instead of conventional treatment at elevated temperatures ranging from 300° to 750° C., with little difference in the resultant film other than high temperature resistance. The coating of the invention applied at ambient temperature exhibits desirable scratch and dirt resistance, differing from a coating applied at high temperature primarily in its unsuitability for use with any subsequent elevated temperature depositions on the ambient-temperature-applied film. The ambient-temperature-applied mating has a substantial cost advantage over the high temperature coating due to differences associated with deposition equipment that require elevated temperatures as compared to an ambient environment. This cost of equipment could materially affect the price for coating and would certainly require different handling of the glass items. The present invention has therefore enabled the glass art to eliminate an important step of the prior art, namely pyrolytic depositions of a permanent coating, in favor of ambient and reduced temperature depositions.

The coating produced as a result of this invention does not significantly alter the optical properties of the uncoated glass (transmission, absorption, & reflection of radiant energy in the visible, ultraviolet, and infrared bands of wave lengths). The coated clear glass surface has substantially the same optical properties to the naked eye as the corresponding uncoated glass. Tables contained in U.S. Pat. No. 3,660,061 have examples of treated glass produced by other processes and of untreated glass, showing various optical properties of glass, that are also obtained with the coating of the present invention.

An additional benefit of the coating of this invention is that upon continuous exposure to hot sunlight, the coated glass article absorbs and reflects incident radiation almost exclusively at its coated surface rather than distributed throughout its thickness and is less liable to undergo stresses that induce fracture. This aspect is not an original goal of the coating processes, but nevertheless has been found to be an advantage of the coating.

The coated surface of the invention contains relatively less oxygen and silicon than untreated glass and more carbon, which provides a better resistance to chemical attack as indicated by accelerated salt spray testing. Outdoor exposure tests or weather resistance test (using the equivalent of a sunshine weather meter according to JIS D 0205 to measure the length of time elapsed before a change in appearance of the coating film is perceivable by visual observation) indicate substantially improved performance of the treated glass of the invention compared to the untreated glass samples tested.

Substrate Preparation Method

Any type of glass can be used in the prococess of the invention (see above for a discussion of glass and types of glass), but ordinary soda-lime glass is a preferred substrate. Glass to be coated in the manner of this invention should be free from unwanted organic and inorganic materials in order to allow uniform coating of the surface to be treated. In particular, removal of organic materials (such as oils) is desirable in all areas that are being treated, since the presence of organic materials would mask the surface from being exposed to vapor from the reactive silane and carbon source. For example, greasy fingerprints effectively mask the substrate from vapors, although dusty fingerprints do not. These considerations are no different than the considerations that exist for other coating processes, so that the care to be taken in cleaning the glass surface is the same as that for other processes. Once the glass is cleaned, areas of the glass that are not intended to be exposed can be masked using tape or other masking agents in the normal manner.

Some components used in the cleaning process, particularly ammonia, can be incorporated into the glass surface if not completely removed in the washing process. The use of ammonia causes a surface that is more rich in nitrogen, thereby reducing the relative amounts of carbon and oxygen in the surface to produce a surface that is more rich in silicon nitride than would be a surface prepared in the absence of ammonia used in the cleaning process. Ammonia has shown a similar ability in high-temperature pyrolysis coating process to form silicon-nitride surfaces in the presence of silanes.

On the other hand, nitrogen does not become incorporated into the glass surface simply because ammonia was used to clean the glass. If sufficient time is provided so that all of the ammonia evaporates, the product obtained after a washing with ammonia contains little or no nitrogen (see Example 9 below) and has a silicon/carbon surface similar to those obtained in the absence of nitrogen-containing wash solutions.

A typical conventional glass washer is acceptable if it air-dries the glass, permitting excess water to evaporate without additional heating of the glass. Excessive water in the surface of the glass requires greater amounts of vaporized chemical solution to create the protective film and produces excessive amounts of reaction by-products, mostly HCl, accordingly. This corrosive vapor should be removed from the chamber atmosphere before exposing humans to the glass as a safety concern.

In lieu of a conventional glass washer, manually cleaning a glass surface with a solution of water and preferably a degreasing component, such as a solution of alcohol and water or less preferably ammonia and water, and then allowing the glass to air-dry for a brief period of time to evaporate excess water has proven to be an acceptable practice.

U.S. Pat. No. 4,670,033 describes a process to demoisturize glass that can be used before applying a coating of this invention. It describes an energy-decomposable compound subject to react with water for the purpose of removing the water and produces a hydroxide, forming a glass network structure while producing hydrogen or hydrocarbons. Although the mechanism is not well understood, it is believed to involve adsorption of an electron donating compound on the glass surface. However, the reactions (of the energy-decomposable compounds and water) often proceed violently and could destroy any glass network structure previously created if not adequately diluted to reduce the violence of the reaction. In such cases a coating of the invention would not be well attached to the glass surface. Because of this danger, simple drying techniques to remove excess water are preferred over chemical drying techniques.

The Process Chamber and Deposition Process

Clean glass is positioned in a reaction chamber which encloses the vaporized chemical solution and permits the vapor to react on the clean glass surface. The glass is usually at ambient temperatures ranging from 1° to 35° C., preferably 20° to 25° C., and preferably has been at some relatively stable temperature (+/−5°) for at least 30 minutes. Experiments have shown that lower temperatures do not produce coatings that are durable, compared to those made within the range defined, and coatings applied at temperatures greater than 35° C. seem to afford a reduced resistance to chemical attack. Measurements by scanning electron microscopy (SEM) of the film thickness for depositions indicate that depositions made at higher temperatures tend to be thinner than those done within the range described, which could account for the reduced chemical resistance observed. Electron spectroscopy of chemical analysis (ESCA) results do not indicate any substantial change in the elemental composition of the film with change in temperature.

The chamber is preferably provided with air circulation, such as a blower, ducting, and baffles creating a dynamic air movement around the glass item to be coated. For example, a satisfactory air flow typically circulates at least two volumes of air (i.e., the air trapped in the chamber that contains the vapor) per minute, preferably three or more volumes per minute. Good results have been demonstrated using a dynamic air flow of about 800 cubic feet per minute in a chamber with a volume of 256 cubic feet. More turbulence and dynamic air flow causes better vaporization of the chemical compounds (most silanes are liquids at the temperatures and pressures used) and more uniform deposition results. Vaporization in static air is less desirable for commercial processes as the process that relies on diffusion is slower and may require more reagents because of reactions at surfaces other than the glass surface being coated. Pressure in the chamber is typically in the range of 0.1 to 1.2 atmospheres, more commonly 100 to 800 torr, especially 600 to 800 torr, and is generally not finely controlled, with preferred conditions being simple atmospheric pressure or at a slight overpressure resulting from the process of blowing filtered air into the chamber to encourage circulation and evaporation of the reagent.

Any of the chemical solution injection methods used to introduce a liquid chemical solution into a dynamic air stream such that it becomes atomized and vaporous, in the manner that the carburetor on a gasoline engine mixes the liquid gasoline with air for combustion in the engine, can be used in the practice of the invention. The injection apparatus can be the same as that used in the patents described above using high-temperature deposition; injection of the liquid into static air or an air stream is the same, with the differences occurring after injection. Deposition of the film-producing silane component is in the form of vapor (gas) resulting from the small amount of liquid silane that is introduced into the chamber and vaporized (sosme silanes are gases under the conditions used, in which case deposition is not an issue; see below). If droplets are present, adverse effects are seen in the properties of the surface. The amount of exposed glass surface in the reaction chamber does not affect deposition in a typical chamber of the type described here, since the vapor carries about 1,000 times more chemical than is reacted on the surface of the glass substrate. For economic operation, the chamber will be generally designed to contain from about 200 to about 1,000 square feet of surface to be treated. It is the area of the surface to be treated, not the volume of the glass, that is important in determining the amount of silicon-containing compound that will be used, as described below.

Introducing the Silicon-Containing Compound

The injection method need not be precise in volumetric ratio of silane to air or in absolute quantity of the silane and can best be described as empirically determined by the chamber being used. Guidelines and initial estimates are set out below, but the amount of silane used in any specific chamber is best described as adequate to achieve the surface described here. "Adequate" means an amount sufficient to cover the surface area of glass present in the chamber. This amount will readily be determined by simple experimentation in order to provide good economic production techniques. Some adjustment of the amount of silicon-containing compound per volume of circulating air may be necessary because of the design of an individual reaction chamber and the amount of moisture present in the glass being treated (which depends most directly on the relative humidity in the atmosphere in which the glass is stored and the cleaning process, including drying time). However, precision is not required. Numerous experiments performed using the same process chamber with a similar velocity air flow but with different amounts of chemical agents have shown that chemical solution quantities ranging from 0.1 μL to 3.0 μL in a 1000 liter chamber tend to produce a similar quality of film (1:30 ratio Δ) for 1,000 square feet of surface being treated. The major observable difference was that the greater quantity of chemical solution tended to leave an oily, hazy film on the coated surface which had to be manually removed. Also, the higher ratio of liquid to air did require additional time to vent the process chamber, using exhaust scrubbers, to remove greater quantities of hydrochloric acid vapors.

Conditions within the Process Chamber

The process chamber is configured to have a filtered air intake for the blowers, a distribution manifold to circulate the air within the chamber, various ports to permit the injection of chemical solutions into the circulating air stream, valves to permit routing the air flow out of the chamber through scrubbers to remove reaction by-products before venting to the atmosphere, and observation ports to verify position of the glass pieces within the chamber. The components of the process chamber used in the present invention are no different from the ones that would be used in the prior art chambers using circulating air to deposit materials on the surface of glass, but without the vacuum or heating capacities being required. The chamber can be quite simple and can even be formed from simple plastic sheeting draped over and enclosing a surface to be treated (such as an automobile window already installed in a vehicle). Such sheeting would be sealed at its edges (tape is sufficient) to provide an isolated chamber in which the reaction can take place.

The operation of the blowers typically forces atmospheric filtered air into the chamber creating a slightly positive pressure relative to the standard atmospheric pressure of 14.7 psi (or 29.92" Hg) at sea level. This method has proven to be satisfactory since it readily permits the atomization and vaporization of the liquid chemical solution as it is injected into the chamber, rather than using a separate step to accomplish this in a volatile carrier gas such as butane or hydrogen, although such carrier gases can be used as a source of carbon where necessary, as described below in connection with the chemical compositions used in the practice of the invention.

The absolute cleanliness and absence of foreign materials afforded the deposition process by using a vacuum environment was not necessary to produce the product created by this invention. A vacuum-type system would be substantially more expensive and would require longer cycle times than the atmospheric positive pressure chamber. However, the method works well in a vacuum chamber.

Material handling fixtures for moving and positioning the glass are similar to what is presently used in the industry, with the exception that they are not subject to elevated temperatures.

The relative humidity within the chamber can be controlled if desired (preferably to be within 5 and 65% relatively humidity, more preferably within 10 and 60% relatively humidity) so as to increase the reproducibility of the coating process. However, the amount of added silane can be adjusted if desired (increasing amounts with increasing relative humidity) to provide sufficient silane to remain reactive after reaction of an initial portion of the silane with moisture present in the reaction chamber other than on the glass surface being treated.

The Film created by the Coating Process

The reaction of a chemical reagent comprising a silane and a carbon source, vaporized in a normal earth-type atmosphere containing oxygen, nitrogen, etc., with the surface of porous, cleaned glass containing some trace amounts of water (and possibly alcohol or ammonia from a wash solution) will rapidly create a glass network structure which is primarily made of silicon, carbon, and oxygen. The film produced by this reaction tends to be rich in carbon and is much like silicon-carbide. If ammonia is present, it can also have more nitrogen, less oxygen, and be a silicon carbide/nitride film. Both are harder than ordinary soda-line glass, resist alkali attack better, and tend to be more hydrophobic, yet thin and transparent.

The coating process of the invention does not have to create film with a precisely uniform elemental composition to be acceptable for the indicated purposes. The film composition can vary over a significant range of compositions (discussed in detail below) and also can be less than a complete consolidation or coating of the porous glass surface while still imparting substantial protection. The thin silicon/carbon-containing composition of the coating surface has been identified by ESCA (Electron Spectroscopy of Chemical Analysis) and (AES) Auger Electron Spectroscopy for elemental composition information and chemical data, which is representative of the films of the invention in general, is set out in the examples that follow and elsewhere below. Visual interpretation of SEM (Scanning Electron Microscopy) data at magnifications of 5,000x, 40,000x, and 150,000x revealed the approximate thickness of the coating to be 100–600, preferably 200–400, Angsttoms thick and penetration into the surface of the glass about the same distance, 100–600 Angstroms, preferably 200–400 Angsttoms. These thicknesses result from the production processes used to date, and there is no reason to believe that thicker coating could not be produced using longer exposure times and other techniques known in the art (such multiple treatments), although penetration distances into the original surface are not likely to be affected by techniques designed to provide a thicker surface layer.

The molar ratio of silicon to carbon in the coating can vary because of the ability of the two elements to replace each other in inorganic compositions (both are within group IV of the periodic table of the elements). While a normal glass surface might have a carbon content of less than one atom percent, surfaces of the invention have a carbon atom percent of at least 25%, preferably 35% to 55%. The atomic ratio of silicon to carbon in ordinary glass is generally 100:1 or more, while in a glass surface of the invention the atom ratio of silicon to carbon is generally less than 1:1, and typically ranges from 2:3 to 1:3. The remainder of the components on the surface are those normally present in glass surfaces, such as magnesium, calcium, oxygen, sodium, and zinc. Although most of these elements will be present as a result of the production of the glass and therefore are not specifically related to the treatment process of the invention, some metal ions or organic components may be present as a result of the use of ordinary atmospheric air in the coating process (as described below), as such air can contain elements resulting from industrial pollution. Other metal ions can migrate from the glass composition as it was formed during manufacture into the surface itself. Typical surface layers of the invention (especially the top 100 Angstroms of the surface) can contain from 0–1% magnesium, 0–1% calcium, 0–0.75% tin, 0–0.75% zinc, and 0–2% sodium, with the silicon and carbon content being as previously defined and the remainder being oxygen. Specific examples of compositions of the invention are set forth below.

The more satisfactory coatings have a higher carbon content and a lesser corresponding amount of oxygen and silicon. The amounts of carbon is typically 10x greater than is found in ordinary soda-lime glass while the amounts of oxygen found is about 50% and the amounts of silicon found is also reduced to about half of that in ordinary soda-lime glass.

The coating applied by pyrolysis (high temperature) techniques of the prior art is considerably more dense, homogeneous, and uniform than the film of the invention deposited at ambient temperatures by CVD methods, and the prior art coatings produced by pyrolysis have a different chemical composition. For this reason, subsequent depositions (such as productions of metal films) using pyrolysis methods at elevated temperatures on ambient CVD films of the invention have uniformity and adhesion problems caused by the irregular elemental composition of the films (surfaces of the invention). Nevertheless, the surface films of the invention are perfectly suitable for the indicated uses where no high-temperature deposition techniques will be used after the film is formed.

It was discovered that the chemicals used in the cleaning process add elements during the creation of the film so as to produce different film compositions, all of which still have satisfactory characteristics for the functional application intended in this invention. This was later verified by controlled experimentation. The coatings produced when the glass surface has been prepared with cleaning solutions containing acetic acid, alcohol, or ammonia and water as the majority component are all elementally different when analyzed by ESCA, yet function equally well to reduce the entry of foreign debris into the surface of patterned glass. These cleaning solutions are sources for oxygen (e.g., $O_2$, $H_2O$) and nitrogen (e.g., $N_2H_4$, $NH_3$) elements when the coating is formed.

Chemical Compositions and Amounts used in the Coating Process

The exact chemical mechanism of the film-forming reactions that occur in this invention is not known. However, the types of reactants being used and the composition of the surface indicate that the silane and carbon source are decomposed on the surface of the glass to form a composition that resembles a silicon carbide. The invention therefore requires the use of a silane compound that can react with hydroxide groups in water and/or in the silica in the surface of the glass being treated. No particular reactivity of the carbon source appears to be necessary, since alkanes can be used as the carbon source. Whatever the mechanism of the remaining steps, reactions continue so as to produce a surface rich in carbon and silicon and relatively depleted in oxygen. The surface may contain silicon carbides, but the invention is not limited to just SiC structures because of the ability of silicon and carbon to be present in other (often non-stoichiometric) ratios in inorganic compositions.

Silanes are silicon analogues of organic compounds based on carbon; the word "silane" is generally used to mean compounds in which the silicon atom is bonded to other atoms by single bonds in contrast to, for example, siloxanes, which have a Si-O double bond. Silanes capable of reacting with water to form the surfaces described here will typically have at least one hydrogen or halogen atom directly attached to silicon, although more complex molecules, such as alkoxide derivatives, can be used. For the purposes of this invention, preferred silanes are those of the formula $Si_nH_{2n+2}$ (the silicon analogue of an alkane) as well as derivatives thereof in which one or more hydrogen atom is replaced by a halogen atom (preferably by a chlorine atom) or by an alkyl or alkoxy group (especially an alkyl group; alkyl groups, whether as themselves or in an alkoxy group preferably have 4 or fewer carbons, more preferably 1 or 2 carbons, especially methyl). Compounds having a higher vapor pressure at the temperature being used for the coating process are preferred over other silanes of similar formula but with lower vapor pressures. Silane itself ($SiH_4$) is a gas at the temperatures used here, as are a number of the other lower-molecular-weight silanes (such as chloro- and dichlorosilane; boiling points −30 and 8° C., respectively). Gaseous silanes can readily be used, although they are not as easy to store as silanes that are liquids at ambient temperature. However, the gaseous silanes are not as limited in terms of the upper limit of concentration that can be used (see below) as they do not condense on the glass surface.

For the sake of simplicity, all silanes used in gaseous form under the conditions of the process of the invention are referred to as "vapors" even if not formed by evaporation from a liquid silane.

A number of silane formulations (including $SiH_4$, $SiH_3Cl$, $SiHCl_3$, and $Me_2Cl_2Si$) were evaluated to discover which ones provided the best glass surface films. Complex or hazardous solvents necessary to transport the elemental compounds can be used but are usually avoided because of expense and toxicity, and commercially available silane mixtures are used as preferred compositions. However, silanes can present a health problem if not properly used, and manufacturer's instructions for safety should be carefully followed.

It is necessary to use a carbon-containing carrier gas such as butane or another hydrocarbon gas concurrently with silane compounds that do not contain carbon in order to create the silicon-carbide-containing film of the invention. Any hydrocarbon compound that is a gas under the conditions used in the deposition process (set out above) can be used as the carbon source; such hydrocarbons typically contain 5 carbons or fewer, more generally 4 carbons or fewer. Typical examples are methane, ethane, propane, butane (including both of its isomers), and neopentane as well as unsaturated hydrocarbons such as ethylene and acetylene. Other simple carbon compounds that are either gaseous or that have high vapor pressure at the ambient temperatures described here, such as dimethyl ether and diethyl ether, can also be used. If the silane compound already contains carbon, no carrier is required, as the silane also functions as the carbon source. Preferred silane compounds contain two or more carbon atoms per silicon atom and do not contain oxygen. Hydrogen can be used as a carrier, but several experiments showed that the potential flammability hazards of this process would be high and objectionable, so such processes are not preferred. In preferred embodiments, the carrier gas is simply atmospheric air.

Dichlorodimethylsilane, 99% $(CH_3)_2SiCl_2$ as available commercially, was used in some preferred embodiments. It was found that this material, combined in very small proportions with air, reacted with the water in the glass substrate to produce a silicon/carbon film which had the desired properties for a transparent protective film of the invention. Additional experiments proved the process to be inexact and have a wide latitude of acceptable conditions to create a satisfactory coating with a minimum of safety precautions required.

Experiments with the ratio of liquid silane solution to air or carrier gases such as butane, ether, and propane have been done over a wide range to discovery definite preferable compositions. Excessive liquid compound quantities are considered to be any amount that produces greater than 1 part vapor to 10,000 parts of atmosphere (V/V), with the liquid requiring vaporization in this ratio prior to contacting the glass surface. Preferred initial ratios (subject to adjustment for the particular chamber used as described elsewhere) are in the range of from $1:10^7$ to $30:10^6$. The upper limit for any set of working conditions can be readily determined from the condition of the film that forms on the glass. When sufficiently great quantities of silane are present so that liquid silane collects on the glass surface, the resultant crystalline surface structures are very fragile, becoming functionally ineffective to provide the protective film this invention describes. A dichlorodimethylsilane-rich mixture produces a surface that is very similar to other polymer-type coatings that are temporary and ablative when exposed to an aggressive environment. The coating applied by the dichlorodimethylsilane-rich mixture can, however, be removed from the glass surface using a solvent, then wiped with alcohol in a solution containing 50% water, and allowed to air-dry before re-applying a satisfactory coating in the prescribed manner.

Typical lower limits of the silane compound are from about 1 to about 3 parts per million of circulating air. Lower concentrations have not been likely to produce uniform and complete film growth, although it may be possible to design reaction chambers to allow use of such low concentrations. It appears that the silane reacts with the surface of the chamber and possibly with water adsorbed on the chamber surface, thereby removing the silane from the atmosphere in the chamber before it can react with the glass. Excess water on the surface of the glass can also increase the amount of silane needed. Accordingly, a minimum amount of the silane must be present before any silane remains to react with the glass surface.

As previously indicated, both the upper and lower limits of the ratio of the silicon-containing compound to the circulating air can best be determined by experimentation for the chamber actually being used. In such experimentation, actual limits for future use would be determined by selecting for a given chamber design one of the limits (upper or lower) as described herein as a starting point for the investigation and then carrying out the reaction as described. If, for example, inadequate coverage is seen for a lower limit, the actual working lower limit for that chamber would be higher, and the next experimental run would simply increase the amount of silicon-containing compound and/or carbon-containing compound in the circulating atmosphere until adequate coverage was obtained.

The invention now being generally described, the same will be better understood by reference to the following detailed examples, which are presented for illustration and are not intended to limit the invention unless so specified.

EXAMPLES

Example 1: Testing procedures to determine functional properties of surface films Films prepared according to the method of the invention (or other films prepared in evaluations of modifications of the specific examples given here) can be evaluated for water repellency and durability of the surface using a series of steps. The tests used in evaluating the films of the invention are set out below (other tests common to the glass industry can be used instead of these tests if more readily available to a potential manufacturer).

Phase 1: Initial manual and visual testing of a fresh coating:

Step 1—Water repellency: a drop of deionized water pools like mercury, runs off without leaving traces.

Step 2—Tactile feel: slippery to the touch, smooth, no rough edges, will not scratch off.

Step 3—Transparency: optically non-distorting visual image is visible through the glass.

Step 4—Abrasion resistance: polish to see if coating discolors, cracks, peels, or is abraded or removed.

Phase 2: Further testing procedures:

Step 1—Heat resistance: tap water from hot side running over sample for 1 minute.

Step 2—Abrasion resistance: rub dry and look for coating to come off after heat and friction of rub.

Step 3—Resistance to exposure to sunlight: water spray every 4 hours; note evaporation effects; look for water marks after 40 hours of continuous exposure.

Step 4—Heat resistance: pressure cook at 240° F. for 1, 2, 4, 8, 16, 24 hour steps; examine after each step; if OK proceed, if defective stop and note results.

Step 5—Use resistance: put into shower, subject to soap scum exposure, warm water, repeated daily; note any build-up; mask and clean part of exposed area weekly for 5 weeks.

Step 6—Salt water spray and weather exposure: extended testing for adhesion, discoloration, cracking, chemical attack and penetration, durability of coating.

Example 2: Glass cleaning techniques

A variety of different glass cleaning techniques were used in the following examples. These techniques, referred to by identifying letters, are set out below.

Process A: Initial glass cleaning procedure

1. Clean glass with 50% isopropyl alcohol solution and deionized water using paper towel.

2. Let sample air dry at room temperature in a draft-free place.

3. Put in a desiccated storage box for temperature and humidity conditioning for 12 to 24 hours.

4. Put in a reduced pressure chamber (0.1 Toro at 25° C. for 12 hours with a nitrogen flow of 25 SCCM.

Process B: Subsequent glass cleaning procedure

As in Process A, but delete Step 4; very little coating difference was noted between glass samples completely dry in a vacuum chamber and under a nitrogen stream and those left at room temperature and nominal humidity.

Process C: Modified cleaning procedure

1. Clean glass with 30% ammonia solution and deionized water using paper towel.

2. Let sample dry in filtered clean chamber with ambient room temperature air and nominal relative humidity; no forced air circulation.

Process D: Modified subsequent cleaning procedure

Glass has been temperature stabilized at 20° C. for minimum of 8 hours. Delete Step 3 of Process A.

1. Clean glass with 10% methylene chloride ($CH_2Cl_2$) and deionized water.

2. Repeat cleaning with 20% alcohol solution and deionized water.

3. Let sample dry in a draft-free location at room temperature (20° C.) and nominal relative humidity; no forced air circulation.

Process E: Variations to cleaning procedure to evaluate coating results

1. Control relative humidity of environmental chamber to affect water content of sample.

2. Control temperature of chamber to condition sample prior to coating.

3. Control of temperature (±1° C.) and relative humidity (±5%) prior to coating.

Example 3: Preparation of film on glass (first comparative example)

A 6-mm thick soda-lime float glass sample was cleaned (method B) with an alcohol and water solution, then left to air dry in a desiccated chamber having a relative humidity of 50% at ambient temperatures (20° C.) for 12 hours.

The cleaned sample was positioned in a reaction chamber at atmospheric pressure where filtered air was directed over it and recirculated within the chamber. The pressure in the chamber was raised slightly by the addition of the filtered air in the sealed chamber.

A liquid $C_2H_6Cl_2Si$ compound was introduced into the chamber in the ratio of about $1:1\times10^5$ and allowed to circulate for 5 minutes. This concentration was sufficiently high so that the liquid condensed on the sample. The chamber was then evacuated, refilled with nitrogen, and purged in this manner several times.

The sample was removed and noted to have been coated with an oily film where the liquid compound dripped on the surface prior to reacting with the moisture in the ghss and the chamber atmosphere. Tested per Example 1, Phase 1. In view of these poor results, higher level tests were not conducted.

Example 4: Preparation of film on glass (second comparative example)

A conditioned sample was placed in the chamber as in Example 3. The chamber was modified in incorporate deflectors to circulate the air and distribute the liquid $C_2H_6Cl_2Si$ compound better than previously.

The liquid was injected as an atomized mist, rather than drops, into the chamber in the ratio of $\sim 1:1\times10^6$ in the same process as before. The chamber was evacuated and purged after 5 minutes and the sample removed. It had no evidence of the oily coating previously noticed.

The sample was subject to water repellency testing (Example 1, Phase 1) which indicated some hydrophobic properties. However, the film was still not satisfactory in terms of strength and permanency.

Example 5: Preparation of film on glass (third comparative example)

The same conditions as in Example 4, except the ratio was adjusted to ~30 liquid $C_2H_6Cl_2Si$ compound: air $1\times10^5$ by volume.

The chamber was evacuated and purged after 5 minutes and the sample removed.

The sample was then subjected to water repellency testing (Example 1, Phase 1), which indicated improved hydrophobic properties compared to Example 4, but was still not satisfactory as a permanent film.

Example 6: Preparation of film on glass (fourth comparative example)

The sample was cleaned with alcohol and stored in an air-tight container for 12 hours. It was then positioned in the chamber having deflectors for improved air circulation where it was subject to filtered air with a relative humidity of 10% at 20° C.

A solution of $C_2H_6Cl_2Si$ was injected into the circulating air within the chamber in the ratio of 30: $1\times10^7$. The chamber was evacuated and purged after 5 minutes and the sample removed.

The sample was then subjected to water repellency testing which indicated reduced hydrophobic properties compared to previous samples, but still not at the desired level of permanency.

Example 7: Preparation of film on glass (fifth comparative example)

The same conditions as Example 6 but adjusting the ratio to 1: $1\times10^6$.

The sample was then subjected to water repellency testing which indicated improved hydrophobic properties, compared to Example 6 but still not at the desired level of permanency.

Example 8: Preparation of film on glass (sixth comparative example)

The same conditions as Example 6 but adjusting the ratio to 30: $1\times10^6$.

The sample was then subjected to water repellency testing which indicated improved hydrophobic properties compared to Example 7 and equal to Example 5.

Example 9: Preparation of silicon-carbon film on glass (embodiment of the invention)

The sample was cleaned with an ammonia and water solution (method C) to be analyzed for elemental composition. Used Example 8 conditions with the ratio 30: $1\times10^6$. A permanent film of the invention was obtained. Unfortunately, the moisture content of the glass surface being treated was not measured, so the reason for forming a permanent film in this example and not in Example 8 is uncertain. It is believed, however, to be due to the different cleaning techniques, which may have resulted in different water contents on the surface of the glass at the time of the coating process. This example shows the importance of adjusting operating conditions empirically so as to select the right amount of silane.

Example 10: Preparation of silicon-carbon film on glass (embodiment of the invention)

An alcohol-cleaned sample (method B) was conditioned at 5° for 12 hours at 50% relative humidity then subjected to coating with a 30: $1\times10^7$ liquid $C_2H_6Cl_2Si$ compound air. The chamber was evacuated and purged after 5 minutes and the sample removed. The sample was then subjected to water repellency testing which indicated improved hydrophobic properties, better than found with Example 5 and similar to those of Example 9. This example shows that controlling the humidity and other conditions responsible for the water content of the glass and chamber surfaces allows predictable and reproducible results.

Example 11: Preparation of silicon-carbon film on glass (embodiment of the invention)

Samples cleaned (method B) and temperature-conditioned at 10°, 15°, 20°, 25°, and 30° C. were coated with the same ratio, 30: $1\times10^7$ liquid $C_2H_6Cl_2Si$ compound: air. All showed improved properties when tested per Example 1, Phase 1 and 2, Steps 1, 2, 3, 4, and 5 and had the permanency of the samples produced in Examples 9 and 10.

Example 12: Preparation of silicon-carbon film on glass (embodiment of the invention)

Alcohol-cleaned samples (method B) were humidity-conditioned at 25° C. ranging from 10% to 75% relative humidity, in 5% increments, for 24 hours, then coated with liquid $C_2H_6Cl_2Si$ compound at the ratio of 30: $1\times10^7$.

The 65% and 70% RH samples did not have as good hydrophobic properties as those with the lower RH which were coated when tested per Example 1, Phase 1 and 2, Steps 1, 2, 3, 4, and 5. This example, together with Examples 10 and 12, shows the desirability of humidity control when reproducible effects are desired for high-volume production.

Example 13: Preparation of silicon-carbon film on glass (embodiment of the invention)

Repeated Example 12 with 65%, 70%, 75% RH samples at 25° C. for 24 hours. Same ratio for liquid $C_2H_6Cl_2Si$ compound. No change when tested per Example 1, Phase 1 and 2, Steps 1, 2, 3, 4, and 5.

Example 14: Chemical analysis of surface films on glass

Three samples of coated float glass that were prepared by the method of the invention were analyzed by ESCA for the chemical content of their surfaces. Results are shown in the table below, which includes a comparison to plain glass prior to coating.

| Element | Plain Glass | Coated Samples* | | |
|---|---|---|---|---|
| Silicon | 53** | 17 | 21 | 26 |
| Carbon | 0.3 | 53 | 45 | 38 |
| Magnesium | 1.6 | 0 | 0.6 | 0 |
| Calcium | 3 | 0.5 | 0.7 | 0.5 |
| Tin | 0.1 | 0 | 0.4 | 0.2 |
| Oxygen | 36 | 28 | 31 | 35 |

-continued

| Element | Plain Glass | Coated Samples* | | |
|---|---|---|---|---|
| Nickel | 0.3 | 0 | 0 | 0 |
| Zinc | 0.7 | 0.4 | 0 | 0 |
| Sodium | 4 | 1.1 | 1.3 | 0.3 |

*The first two coated samples (17 and 21% silicon) were prepared as described in Example 10. The third sample was prepared as described in Example 9.
**All values in atom %

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A method for producing a coated glass or ceramic article having a surface formed from silicates, said surface being selected from the group consisting of a sandblasted glass, an artistic glass, a float glass, and a Pyrex glass product, said method comprising the steps of:
   contacting the uncoated glass or ceramic article in a gaseous atmosphere at a pressure of at least 700 Torr with a silane vapor and a gaseous carbon source for a sufficient time at a temperature of less than 35° C. to form a coating on and in the glass or ceramic surface, wherein said coating comprises a silicon-carbide-containing layer having a thickness of at least 100 angstroms and containing 35 to 55 atom % carbon, between 15 and 30 atom % silicon, no more than 10 atom % elements other than silicon, oxygen, and carbon, and the remainder oxygen.

2. The method of claim 1, wherein said silane is dichlorodimethysilane, said article being at a temperature ranging from about 20° to about 25° C.

3. The method of claim 1, wherein the carbon source is butane and the silane does not contain carbon.

4. The method of claim 1, wherein said contacting occurs at a relative humidity of from 10 to 60% and a temperature of from 10° to 30° C. and said gaseous atmosphere is air.

5. The method of claim 4, wherein said silane vapor and air are present in a volumetric ratio of from $1:10^7$ to $30:10^6$.

6. The method of claim 4, wherein said air is present at a pressure of from 100 to 800 torr.

7. A method of coating an article with a substantially transparent surface coating, said method comprising steps of:
   providing the article comprising a surface material selected from the group consisting of a sandblasted glass, an artistic glass, a float glass, a Pyrex glass product, and a ceramic material; and
   reacting a silane and a carbon source on said surface material to form a substantially transparent surface coating on said article;
   wherein said surface material is at a temperature ranging from about 1° to about 35° C.

8. The method of claim 7 further comprising a step of washing said surface material with an ammonia solution prior to the reaction step.

9. The method of claim 7 further comprising a step of washing said surface material with an alcohol solution prior to the reaction step.

10. The method of claim 7 wherein said surface material is at a temperature ranging from about 20° to about 25° C.

11. The method of claim 7 wherein said surface material is within about 5° C. of said temperature ranging from about 1° to about 35° C. for at least 30 minutes.

12. The method of claim 7 wherein said step of reacting occurs in a chamber.

13. The method of claim 12 wherein said chamber provides for flow of said silane and said carbon source around said material.

14. The method of claim 12 wherein said chamber provides for a turbulent flow of said silane and said carbon source around said material.

15. The method of claim 13 wherein said flow includes a flow rate replacing at least two volumes of said chamber volume per minute.

16. The method of claim 13 wherein said flow includes a flow rate of about 800 cubic feet per minute, and said chamber includes a volume of about 256 cubic feet.

17. The method of claim 12 wherein said chamber is at a pressure ranging from about 600 to about 800 torr.

18. The method of claim 7 wherein said silane is a liquid silane.

19. The method of claim 7 wherein said transparent surface coating reflects incident radiation substantially at an outer surface region.

20. The method of claim 7 wherein said transparent surface coating includes substantially the same visual optical properties as said surface material.

21. The method of claim 7 wherein said surface material is substantially free from organic materials.

* * * * *